(12) United States Patent
Cohen et al.

(10) Patent No.: US 9,876,090 B1
(45) Date of Patent: Jan. 23, 2018

(54) LATTICE MATCHED AND STRAIN COMPENSATED SINGLE-CRYSTAL COMPOUND FOR GATE DIELECTRIC

(71) Applicant: INTERNATIONAL BUSINESS MACHINES CORPORATION, Armonk, NY (US)

(72) Inventors: Guy M. Cohen, Ossining, NY (US); Martin M. Frank, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,964

(22) Filed: Jun. 30, 2016

(51) Int. Cl.
| | | |
|---|---|---|
| *H01L 29/205* | (2006.01) |
| *H01L 29/51* | (2006.01) |
| *H01L 29/10* | (2006.01) |
| *H01L 29/78* | (2006.01) |
| *H01L 29/66* | (2006.01) |

(52) U.S. Cl.
CPC ........ *H01L 29/517* (2013.01); *H01L 29/1054* (2013.01); *H01L 29/205* (2013.01); *H01L 29/66522* (2013.01); *H01L 29/7843* (2013.01)

(58) Field of Classification Search
CPC .......... H01L 29/7843; H01L 29/66522; H01L 29/205; H01L 29/1054; H01L 29/517
See application file for complete search history.

(56) References Cited

U.S. PATENT DOCUMENTS

| | | | | |
|---|---|---|---|---|
| 5,294,818 A | * | 3/1994 | Fujita ................ | H01L 29/78 257/192 |
| 5,828,101 A | * | 10/1998 | Endo ................. | H01L 27/088 257/330 |
| 6,225,655 B1 | * | 5/2001 | Moise ............... | G11C 29/44 257/233 |
| 6,232,157 B1 | * | 5/2001 | Dodabalapur ....... | H01L 21/743 257/E21.538 |
| 7,632,745 B2 | * | 12/2009 | Chen ................ | H01L 21/28194 257/E21.632 |
| 9,136,357 B1 | * | 9/2015 | Basu ................. | H01L 29/785 |
| 9,263,260 B1 | * | 2/2016 | Basu ................. | H01L 21/0259 |

(Continued)

FOREIGN PATENT DOCUMENTS

| | | | | | |
|---|---|---|---|---|---|
| JP | 63213966 A | * | 9/1988 | ........... | H01L 29/786 |
| JP | 01257372 A | * | 10/1989 | ........... | H01L 29/432 |
| JP | 03046271 A | * | 2/1991 | | |

OTHER PUBLICATIONS

De Jesus, J., "ZnCdMgSe as a Materials Platform for Advanced Photonic Devices: Broadband Quantum Cascade Detectors and Green Semiconductor Disk Lasers" PhD Dissertation, CUNY Academic Works (Feb. 1, 2016) 150 pages.

(Continued)

*Primary Examiner* — Earl Taylor
(74) *Attorney, Agent, or Firm* — Tutunjian & Bitetto, P.C.; Louis J. Percello

(57) ABSTRACT

A transistor device includes a source region, a drain region and a III-V channel material disposed between the source and drain region. A gate dielectric layer is epitaxially grown on the III-V channel material. The gate dielectric layer includes a (X)Se compound, wherein X includes one or more of Zn, Cd and/or Mg. A gate conductor is formed on the gate dielectric layer.

19 Claims, 4 Drawing Sheets

(56) References Cited

U.S. PATENT DOCUMENTS

| | | | | |
|---|---|---|---|---|
| 9,368,574 B1* | 6/2016 | Basu | ................... | H01L 21/0259 |
| 9,484,463 B2* | 11/2016 | Basu | ..................... | H01L 29/785 |
| 9,634,007 B2* | 4/2017 | Pillarisetty | ............ | H01L 27/092 |
| 9,653,606 B2* | 5/2017 | Basu | ..................... | H01L 29/785 |
| 2009/0189252 A1* | 7/2009 | Passlack | ................. | H01L 29/20 |
| | | | | 257/615 |
| 2014/0291726 A1* | 10/2014 | Pillarisetty | .......... | H01L 21/8258 |
| | | | | 257/190 |
| 2015/0243756 A1* | 8/2015 | Obradovic | ........ | H01L 29/66795 |
| | | | | 438/285 |
| 2015/0255567 A1* | 9/2015 | Basu | ..................... | H01L 29/785 |
| | | | | 257/192 |
| 2015/0255568 A1* | 9/2015 | Basu | ..................... | H01L 29/785 |
| | | | | 257/192 |
| 2015/0295084 A1* | 10/2015 | Obradovic | .......... | H01L 29/7845 |
| | | | | 257/347 |
| 2016/0020305 A1* | 1/2016 | Obradovic | .......... | H01L 29/7391 |
| | | | | 257/39 |
| 2016/0133750 A1* | 5/2016 | Basu | ..................... | H01L 29/785 |
| | | | | 257/194 |
| 2016/0172441 A1* | 6/2016 | Basu | ................... | H01L 21/0259 |
| | | | | 438/158 |
| 2016/0293764 A1* | 10/2016 | Ban | ................... | H01L 21/02381 |
| 2017/0148896 A1* | 5/2017 | Basu | ................. | H01L 29/66636 |

OTHER PUBLICATIONS

Shen, A. et al., "MBE growth of ZnCdSe/ZnCdMgSe quantum-well infrared photodetectors" Journal of Vacuum Science & Technology B (May/Jun. 2013) pp. 03C113-1-03C113-3, vol. 31, No. 3.

Semendy, F. et al., "Growth and Characterization of ZnCdMgSe/ZnCdSe Quantum Wells on InP Substrates for Visible Emitters" Army Research Lab Adelphi MD (Oct. 1999) pp. 1-18, No. ARL-TR-2015.

Jain, F.C. et al., "Novel quantum dot gate FETs and nonvolatile memories using lattice-matched II-VI gate insulators" Journal of Electronic Materials (2009) pp. 1574-1578, vol. 38, No. 8.

* cited by examiner

US 9,876,090 B1

LATTICE MATCHED AND STRAIN COMPENSATED SINGLE-CRYSTAL COMPOUND FOR GATE DIELECTRIC

BACKGROUND

Technical Field

The present invention generally relates to semiconductor processing and devices, and more particularly to a crystal semiconductor material employed to form a gate conductor.

Description of the Related Art

Gate dielectrics, such as, e.g., $HfO_2$ or $Al_2O_3$) are employed for InGaAs/InP filed effect transistors (FETs). However, with demands for higher performing and higher density transistor devices, improved carrier mobility and reduced gate leakage are needed over current designs.

SUMMARY

In accordance with an embodiment of the present principles, a transistor device includes a source region, a drain region and a III-V channel material disposed between the source and drain region. A gate dielectric layer is epitaxially grown on the III-V channel material. The gate dielectric layer includes a (X)Se compound, wherein X includes one or more of Zn, Cd and/or Mg. A gate conductor is formed on the gate dielectric layer.

Another transistor device includes a source region, a drain region and a III-V channel material disposed between the source and drain region. A gate dielectric layer is epitaxially grown on the III-V channel material. The gate dielectric layer includes a ZnCdSe compound. A gate conductor is formed on the gate dielectric layer.

Yet another transistor device includes a source region, a drain region and an InGaAs channel material disposed between the source and drain region. A ZnCdSe compound layer is epitaxially grown on the InGaAs channel material, where the ZnCdSe compound layer composition is selected to set a bandgap and a lattice constant in relation to a bandgap and a lattice constant of the InGaAs channel material. A gate conductor is formed on the ZnCdSe compound layer.

A method for forming a transistor device includes providing a III-V channel material; epitaxially growing a (X)Se compound on the III-V channel material, where X includes one or more of Zn, Cd and/or Mg; depositing a gate conductor on the (X)Se compound to form a gate structure; and forming a source region and drain region on opposite sides of the gate structure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
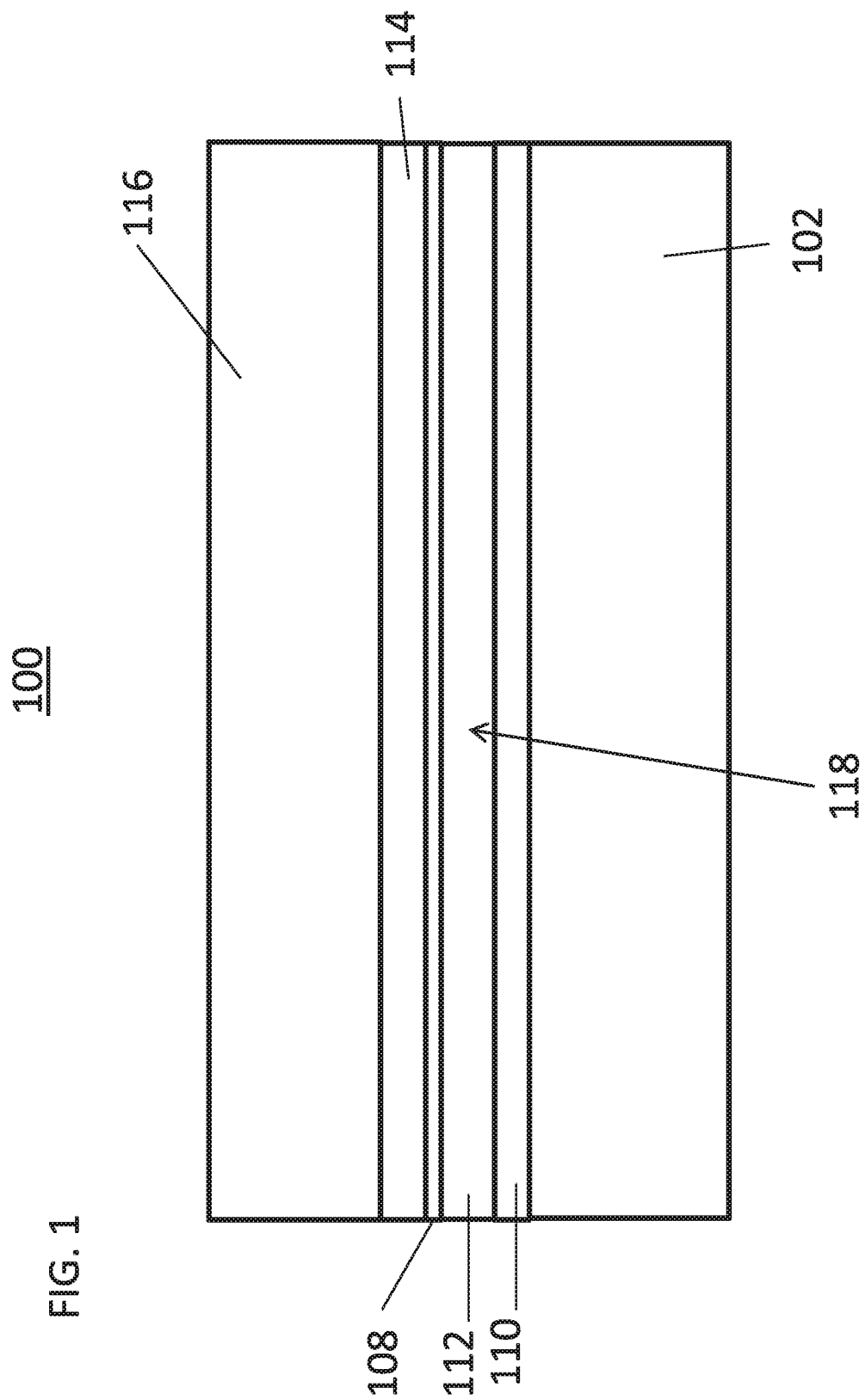
FIG. 1 is a cross-sectional view showing a single crystal a (X)Se compound formed on a III-V channel material as a gate dielectric and having a high-k dielectric layer in accordance with the present principles.

In accordance with the present principles, defect free III-V field effect transistor (FET) channels are provided using lattice-matched gate dielectric materials. Epitaxially grown wide bandgap semiconductors can replace traditional gate dielectrics (e.g., $HfO_2$ or $Al_2O_3$) for III-V (e.g., InGaAs/InP) field effect transistors (FETs). For example, the use of epitaxially grown indium phosphide (InP) and indium aluminum arsenide ($In_{0.5}Al_{0.5}As$) as gate dielectrics for a $In_{0.53}Ga_{0.47}As$ channels can improve carrier mobility due to the near ideal interface between the InGaAs channel and the InP barrier. InP, however, has a conduction band offset ($\Delta E_c$) of only 0.25 eV with respect to InGaAs, which is not enough to reduce gate leakage. InAlAs has a larger conduction band offset of about 0.5 eV which is still insufficient, and also may have reliability issues due to aluminum oxidation.

Channel material may intentionally be made indium rich (e.g., $In_{0.7}Ga_{0.3}As$) to take advantage of lighter electron mass. While an indium rich channel, which is compressive strained, may be grown defect free using a low growth temperature, subsequent anneals at temperatures higher than the growth temperature may lead to relaxation of the layer by forming dislocations. Strain compensation to make the indium rich InGaAs structurally stable may need a capping layer on the channel with a tensile strain.

In accordance with the present principles, structures and methods for the fabrication of FETs with an $In_xGa_{1-x}As$ channel and a gate stack of an epitaxially grown material, e.g., a (X)Se compound, such as, $Zn_xCd_yMg_{1-x-y}Se$, in contact with the channel, a high-k dielectric formed over the $Zn_xCd_yMg_{1-x-y}Se$ layer and a conductive gate electrode formed over the high-k dielectric. The $Zn_xCd_yMg_{1-x-y}Se$ layer and/or the high-k dielectric form a gate dielectric layer.

The present principles employ epitaxially grown lattice-matched materials, such as, e.g., (X)Se, ZnCdSe and $Zn_xCd_yMg_{1-x-y}Se$ layers as a gate dielectric for InGaAs/InP FETs. In one embodiment, the ZnCdSe or $Zn_xCd_yMg_{1-x-y}Se$ material systems have a bandgap of between about 2.1 to about 2.9 eV and a conduction band offset as large as 80% of the bandgap, thus suppressing gate leakage. Since the material can be grown lattice-matched to InP/$In_{0.53}Ga_{0.47}As$, a defect free interface is feasible. This enables achievement of a high carrier mobility in the InGaAs channel and also reduces the density of interface traps (DIT).

When an indium rich channel is employed, the $Zn_xCd_yMg_{1-x-y}Se$ layer can be intentionally grown tensile with respect to InP to permit efficient strain compensation. If the compressive strain in the indium rich InGaAs layer is compensated by the growth of a tensile ZnCdMgSe layer, a net strain close to zero is obtained. A stack of layers employing strain balancing becomes more stable when a wafer on which these device is formed is annealed to a temperature higher than the growth temperature used to deposit the stack. In the case of ZnCdMgSe, both tensile and compressive layers can be grown epitaxially with respect to InP, so both tensile and compressive channel materials could be strain compensated.

The use of a ZnCdMgSe layer in contact with an InGaAs channel does not preclude the use of high-k dielectric materials such as $HfO_2$ and $Al_2O_3$. In one embodiment, a structure that has a thin epitaxial $Zn_xCd_yMg_{1-x-y}Se$ layer over the InGaAs channel may include a cap layer of high-k dielectric material.

A ZnCdSe compound layer may be epitaxially grown on an InGaAs channel material, where the ZnCdSe compound layer includes a band gap and a lattice constant selected based on atomic percent of constituent elements to function as a dielectric layer with interface defects less than about $5 \times 10^{12}$ cm$^{-2}$.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InGaAs. These compounds include different proportions of the elements within the compound, e.g., InGaAs includes $In_xGa_{1-x}As$ where x denotes the fraction of indium and is a number between zero and one (e.g., 0<x<1), etc. For example, when x=0, the compound is GaAs, when x=1 the compound is InAs, and when x=0.53 the compound is $In_{0.53}Ga_{0.47}As$, which is a compound latticed matched to InP. In addition, other elements may be included in the compound and still function in accordance with the present principles. It should be noted that subscript x used in different compounds is not necessarily the same, for example, the "x" in $In_xGa_{1-x}As$, is not the same as "x", used in $Zn_xCd_yMg_{1-x-y}Se$. It should be further noted that subscript x represents atomic fraction while capital X as employed herein will represent a variable element or elements in a compound.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a structure for a field effect transistor (FET) 100 with a III-V channel 118 (e.g., $In_xGa_{1-x}As$) in a substrate 102 is illustratively shown. A semiconductor layer 108 (e.g., (X)Se and in one embodiment, $Zn_xCd_yMg_{1-x-y}Se$) is epitaxially grown in contact with the channel 118. In one embodiment, a high-k dielectric 114 is formed over the epitaxially grown semiconductor layer 108, and a conductive gate electrode 116 is formed over the high-k dielectric 114. The conductive gate electrode 116 may include one or more layers (e.g., a work function metal, etc.).

In one embodiment, the substrate 102 may include a silicon based substrate or a group IV substrate that may include may include, e.g., pure Si, Ge or $Si_xGe_{1-x}$. In one embodiment, a silicon wafer is employed with a top surface or region 110 on the top surface that is "III-V epi-ready". Alternately, the substrate 102 may include a III-V material, such as, e.g., InP, InGaAs, GaAs, etc. In one embodiment, a "III-V epi-ready" layer 110 is employed, and in particular, layer 110 includes InP to form an "InP epi-ready" surface to permit the epitaxial growth of a III-V compound 112 such as, e.g., InGaAs ($In_{0.53}Ga_{0.47}As$) without the introduction of strain in that layer. By epitaxial growth, it is meant that the III-V layer 112 that is added over the "InP epi-ready" layer 110 uses that surface as a template for the growth, and in most cases maintains or mimics the same crystal structure and lattice constant as the underlying "InP epi-ready" surface 110. If the substrate 102 includes a III-V material already, layer or layers 110 are not needed.

The InP epi-ready surface 110 can be formed as a blanket film by substrate engineering methods (also known as, e.g., "virtual substrate") where the Si substrate lattice constant is gradually graded to that of InP by growth of intermediate layers of varying lattice constants. There may be multiple layers employed for layer 110 to provide lattice matching between the wafer 102 and the III-V layer 112 of the channel 118.

Epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial material can be doped during deposition (in-situ doped) by adding dopants, n-type dopants or p-type dopants, depending on the type of transistor. n-type dopants for III-V materials include, e.g., silicon, tin and tellurium, and p-type dopants for III-V materials include, e.g., beryllium and zinc. Some III-V dopants are amphoteric and the type of doping they provide depends on the semiconductor composition. For example, carbon is employed as a p-type dopant for GaAs and $In_{0.53}Ga_{0.47}As$ but is a n-type dopant in InP.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. In some embodiments, epitaxial growth and/or deposition processes are selective to forming on semiconductor surface, and generally do not deposit material on exposed surfaces, such as silicon dioxide or silicon nitride surfaces.

In other embodiments, defects from lattice mismatching may be reduced or eliminated by other processing techniques. For example, regional growth methods such Aspect Ratio Trapping (ART) and/or Confined Epitaxial Lateral Overgrowth (CELO) can be employed to further reduce the number of defects that form due to the large lattice mismatch between, e.g., a Si substrate (102) and the InP epi-ready surface 110. These techniques employ confining growth of an epitaxially grown layer to a limited space and/or area.

The channel layer 112 is epitaxially grown over the InP epi-ready surface 110 (or over the substrate 102, if formed from a suitable material with low lattice mismatch). The channel layer 112 may include InGaAs (e.g., $In_xGa_{1-x}As$ with x=0.53) being latticed matched to InP of layer 110. An indium rich channel (x>0.53) can also be grown for channel layer 112). When the channel layer 112 is indium rich the layer 112 will be under compressive strain since the lattice constant of the epitaxially grown layer 112 is larger than that of the InP epi-ready surface 110.

In one embodiment, the growth of the InGaAs layer 112 may be performed by a method such as MOCVD with precursors such as TMIn (trimethylindium) and TMGa (trimethylgallium) as the indium and gallium sources, and Arsine ($AsH_3$) as the arsenic source. The growth temperature can be between about 450 degrees C. to 700 degrees C. with 550 degrees C. to 650 degrees C. being preferred. One advantage of MOCVD and like methods is that the growth is selective. By "selective" it is meant that the InGaAs material of layer 112 is only added (deposited) over the InP epi-ready surfaces 110 and does not deposit over dielectric surfaces such as, e.g., $SiO_2$ or $Si_3N_4$. In this way, the layer 110 may be patterned, and the layer 112 selectively grown in accordance with the pattern of layer 110.

Another growth method that may be employed includes MBE. With MBE, the indium, gallium and arsenic may be evaporated from Knudsen effusion cells. MBE does not provide the growth selectivity as MOCVD; however, it can allow much lower growth temperatures than MOCVD. MBE is a line-of-sight deposition method so growth over vertical surface (such as fins) may be challenging. After the deposition of the channel layer 112, the dielectric layer 108 is epitaxially grown over the channel layer 112. The dielectric layer 108 may include (X)Se or (X)Te compound, where X includes one or more of Zn, Cd and/or Mg. For example, (X)Se may include CdSe, ZnSe, MgSe, CdMgSe, ZnMgSe, and/or ZnCdSe.

The dielectric layer 108 may include, e.g., ZnCdSe, ZnCdTe, ZnCdMgSe or a similar material. In a particularly useful embodiment, semiconductor layer 108 includes $Zn_xCd_yMg_{1-x-y}Se$. The growth of $Zn_xCd_yMg_{1-x-y}Se$ for layer 108 preferably follows the layer growth of channel layer 112 (e.g., InGaAs) without breaking vacuum. This can be done by using a same growth chamber to grow successively the two layers (112, 108) or by using a cluster tool with a chamber for growing layer 112 (e.g., InGaAs) and another chamber for the growth of layer 108 (e.g., $Zn_xCd_yMg_{1-x-y}Se$). The fraction of x and y in $Zn_xCd_yMg_{1-x-y}Se$ can be independently varied to set the material's lattice constant and bandgap.

Figure 2:
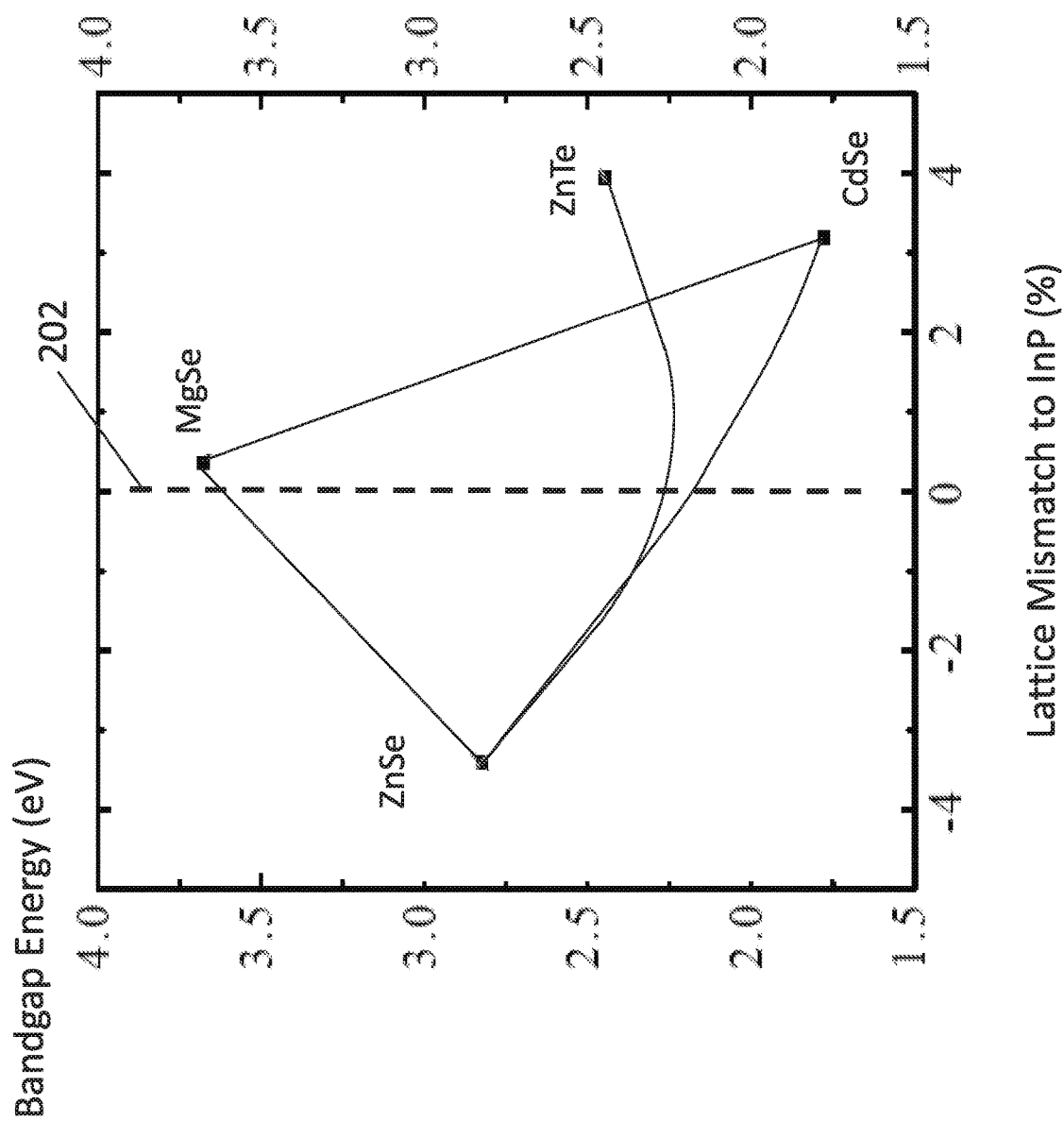
FIG. 2 is a diagram graphing bandgap energy (eV) against lattice mismatch (%) for different (X)Se compounds in accordance with the present principles.

Referring to FIG. 2, a plot of bandgap energy (eV) versus lattice mismatch to InP (%) is illustratively shown. Each or materials ZnSe, MgSe, ZnTe and CdSe are plotted in FIG. 2. The bandgap of $Zn_xCd_yMg_{1-x-y}Se$ is provided as a function of the lattice mismatch to an underlying layer (e.g., to InP or InGaAs). The lattice mismatched is defined as $(a_{ZnCdMgSe}-a_{InP})/a_{InP}$, where a is the lattice constant for the indicated materials. The bandgap of $Zn_xCd_yMg_{1-x-y}Se$ is a function of the elemental composition of Zn, Cd, and Mg which is given by the fractions x and y. As can be seen by dashed vertical line 202, a bandgap of 2.1 eV to over 3.5 eV can be obtained while maintaining lattice matching to InP.

Referring to again to FIG. 1 with continued reference to FIG. 2, when an indium rich $In_xGa_{1-x}As$ channel layer 112 is deposited over InP epi-ready surface 110, the resulting $In_xGa_{1-x}As$ will be strained. Since the lattice constant of $In_xGa_{1-x}As$ with x>0.53 is larger than that of InP, the strain in the $In_xGa_{1-x}As$ layer 112 will be compressive. Using FIG. 2, a strain neutral structure may be obtained by adjusting the fraction of x and y in $Zn_xCd_yMg_{1-x-y}Se$ so it will be deposited with a tensile strain. A strain neutral structure is more stable and will prevent the relaxation of the strain by the introduction of dislocations when the wafer is annealed above the growth temperature.

Following the deposition of the $Zn_xCd_yMg_{1-x-y}Se$ in layer 108, a dielectric layer 114 of high-k dielectric is deposited. The deposition of a high-k dielectric is optional; however, the addition of the high-k layer 114 may be beneficial in reducing the thickness of the $Zn_xCd_yMg_{1-x-y}Se$ layer 108. Layer 108, although semiconducting, may be employed as a dielectric layer and may have a dielectric constant value of between about 11 to about 16.

The high-k layer 114 may be grown or deposited by, e.g., atomic layer deposition (ALD) and/or chemical vapor deposition (CVD). The high-k layer 114 may be silicon nitride, silicon oxynitride, and/or a high-k material, including but not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k dielectric layer 114 may further include dopants such as lanthanum and/or aluminum. The stoichiometry of the high-k dielectric material may vary. In various embodiments, the high-k layer 114 may have a thickness in the range of about 5 nm to about 9 nm. Other dielectric materials may also be employed, e.g., silicon oxide.

Figure 3:
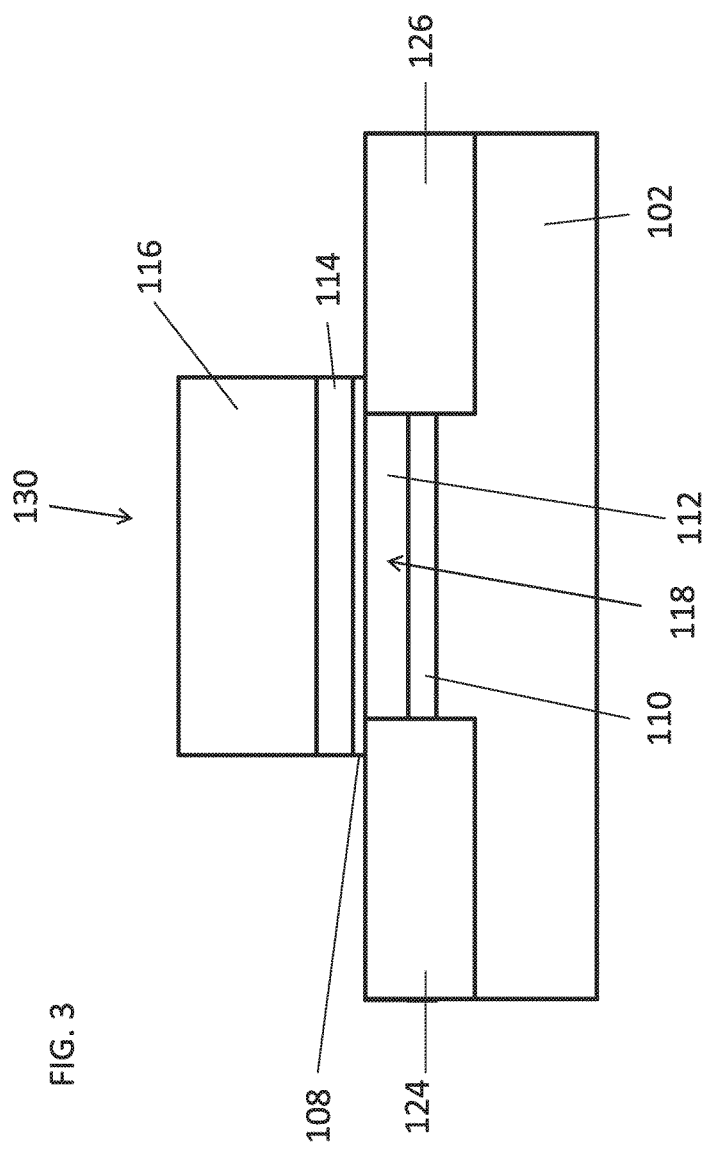
FIG. 3 is a cross-sectional view showing a transistor device having a single crystal (X)Se compound formed on a III-V channel material as a gate dielectric also with a high-k dielectric layer in accordance with the present principles.

Referring to FIG. 3, the transistor device 100 is illustratively shown with a planar device structure. However, the transistor device 100 may be a vertical transistor, a finFET, a nanowire or any other transistor structure. When a fin structure is employed as the channel 118, epitaxial layer 108 is formed on both faces of the fin. Similarly, when the channel 118 is a nanowire, epitaxial layer 108 is formed all around the nanowire surface. The substrate 102 may be doped to form source regions 124 and drain regions 126 in the substrate 102. The source region 124 and drain region 126 may be doped by implantation, diffusion or epitaxially grown on the substrate and doped in-situ (during growth). In-situ doped source/drain regions 124/126 are preferred for III-V devices. The source/drain regions 124/126 may be n-doped or p-doped. The source/drain regions 124/126 may have a dopant concentration in the range of about $1\times10^{19}$ to about $1\times10^{22}$ dopant atoms/cm$^3$. In various embodiments, the source/drain regions 124/126 include a same or different material than the substrate 102 (and/or layer 110). In yet another embodiment, the source/drain regions 124/126 are formed of the same material as channel 118. It should be noted that the positions of the source and a drain may be interchanged.

The channel region 118 is disposed between the source/drain regions 124/126. The channel region 118 may be doped and may include one or more other dopant regions, e.g., halo dopant regions, etc. A gate structure 130 includes dielectric layers 108 and optionally high-k dielectric layer 114.

In one or more embodiments, a gate conductor 116 may be deposited over the high-k dielectric layer 114. The gate conductor 116 may include a work function layer (not shown) that may be conformally deposited by ALD and/or CVD. The work function layer may be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof.

In one or more embodiments, the gate conductor 116 may further include a thin a gate metal layer (not shown) which may be formed on the work function layer, where the gate metal layer may include a thin layer conformally deposited on the work function layer. The gate conductor 116 is deposited to form a gate electrode that may include tungsten (W), aluminum (Al), titanium nitride (TiN), cobalt (Co), etc. or combinations thereof. In various embodiments, the gate structure 130 (and layers thereof) may be etched/patterned in a same or multiple etch processes, e.g., reactive ion etching (RIE). The gate conductor 116 may be formed in a gate first or gate last procedure. In a gate last (replacement gate) procedure a dummy gate material is employed and later replaced with a metal or conductive gate. A gate first procedure forms the gate conductor early in the process.

A dielectric cap layer (not shown) may be deposited over the gate structure 130 to protect the gate conductor 116 and be employed to electrically isolate the gate conductor 116. The source/drain regions 124/126 may be formed by etching away portions of the substrate and/or layer 110, 112. The source/drain regions 124/126 may be epitaxially grown and doped in-situ, or the source/drain regions 124/126 may be formed by implantation, diffusion doping, etc. The gate structure 130 may further include sidewall spacers, contacts and other structures depending on the device type and design.

It should be understood that any device structure may be employed that benefits from the defect free features in accordance with the present principles. The processing illustratively describes a planar FET but the device structure may include any device, e.g., a finFET, a nanowire FET, a vertical FET, etc.

Figure 4:
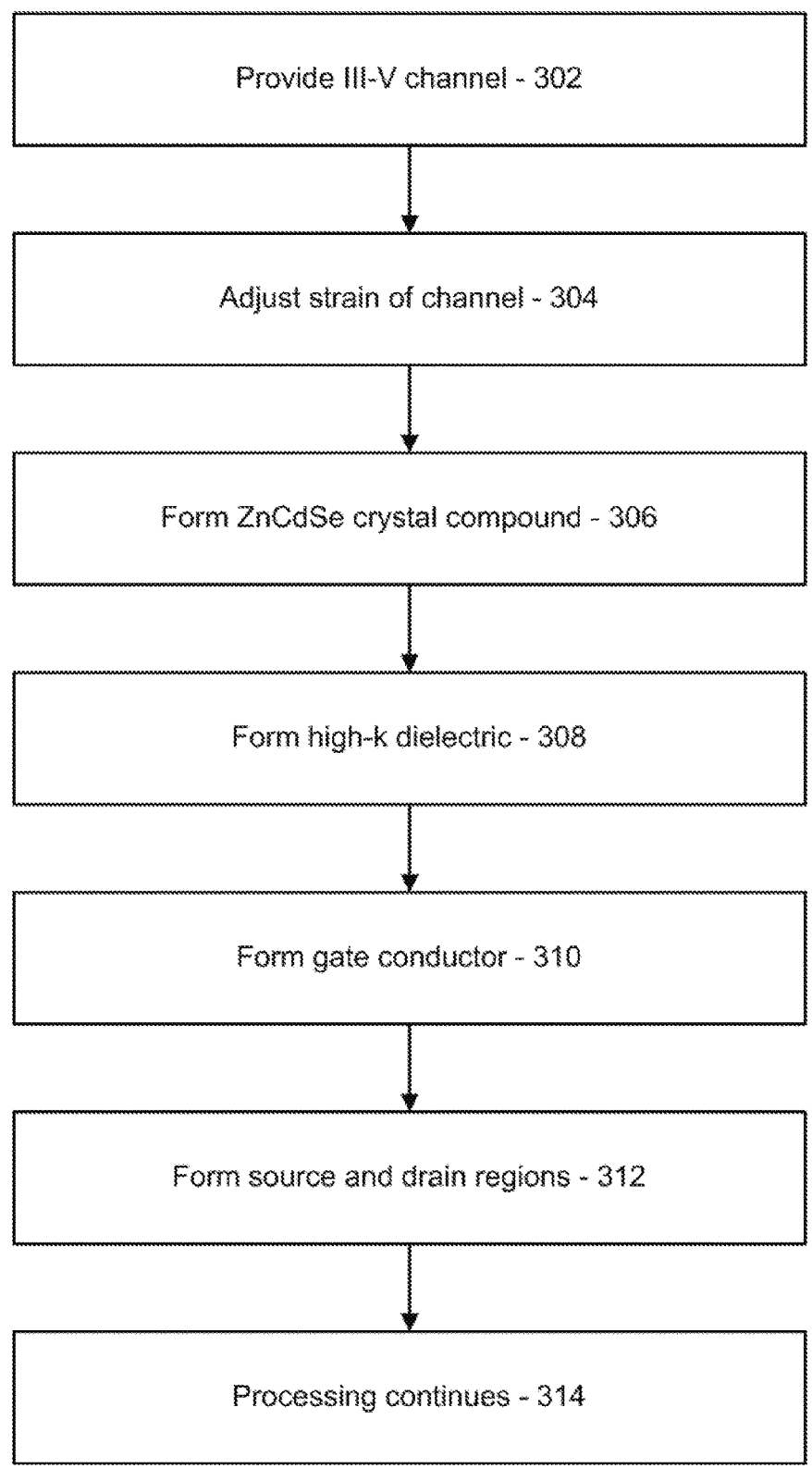
FIG. 4 is a block/flow diagram showing a method for fabricating a transistor device having a single crystal (X)Se compound formed on a III-V channel material in accordance with the present principles.

Referring to FIG. 4, a method for forming a transistor device is illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, a III-V channel material is provided. This may include a III-V substrate, a Si substrate having buffer layers to adjust for lattice mismatch between the Si and the III-V material, or any combination thereof. The III-V channel may include InGaAs although other materials may be employed, e.g., InAs, InP, GaAs, AlInGaAs, InAlAs, etc. In block 304, the III-V channel material may be adjusted to provide tensile or compressive strain. In one embodiment, the channel material includes InGaAs and strain is adjusted by adjusting an atomic weight in accordance with atomic fraction of In in the InGaAs channel material to provide strain in the InGaAs channel material.

In block 306, an (X)Se (or (X)Te) compound, where X includes one or more of Zn, Cd and/or Mg, is epitaxially grown on the III-V channel material. The compound may include Te substituted for some or all of the Se. The compound is preferably formed as a single crystal, and its stoichiometry may be adjusted to lattice match the underlying layer and to provide an appropriate bandgap to function as a gate dielectric material. In one embodiment, the compound includes $Zn_xCd_yMg_{1-x-y}Se$, and x and y are selected to set a bandgap and to lattice match an underlying layer. The (X)Se compound layer may be epitaxially grown on the channel material, where the (X)Se compound layer composition is selected to set a bandgap and a lattice constant in relation to a bandgap and a lattice constant of the channel material.

In block 308, a high-k dielectric layer may be formed on the (X)Se compound. In block 310, a gate conductor is deposited on the (X)Se compound to form a gate structure. Additional gate metals may be employed. The gate conductor, the gate dielectric (the ZnCdSe compound and high-k dielectric, if present) and any other layers are patterned to form the gate structure. The gate structure may include sidewall spacers (e.g., SiN) formed on the sidewalls of the gate structure.

In block 312, source and drain regions are formed on opposite sides of the gate structure. In block 314, processing continues with the formation of interlevel dielectric layers, contact formation, metallizations and other structures.

Having described preferred embodiments for lattice matched and strain compensated single-crystal compound for gate dielectric (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transistor device, comprising:
   a source region;
   a drain region;
   a III-V channel material disposed between the source and drain region;
   a gate dielectric layer epitaxially grown on the III-V channel material, the gate dielectric layer including a (X)Se compound, wherein X includes one or more of Zn, Cd and/or Mg, and wherein the (X)Se compound includes one of ZnCdSe or ZnCdMgSe; and
   a gate conductor formed on the gate dielectric layer.

2. The device as recited in claim 1, wherein the III-V channel material includes InGaAs.

3. The device as recited in claim 1, wherein the (X)Se compound includes $Zn_xCd_yMg_{1-x-y}Se$ where x and y include fractions to provide an operational bandgap while lattice matching to the III-V channel material.

4. The device as recited in claim 1, wherein the gate dielectric layer further comprises a high-k dielectric layer formed over the (X)Se compound.

5. The device as recited in claim 1, wherein the III-V channel material is formed on a silicon based substrate.

6. The device as recited in claim 5, further comprising one or more lattice matching layers disposed between the III-V channel material and the silicon based substrate.

7. The device as recited in claim 1, wherein the III-V channel material is strained in accordance with atomic fractions of the III-V channel material.

8. The device as recited in claim 1, wherein the III-V channel material includes InGaAs and strain is adjusted in accordance with atomic fraction of In in the III-V channel material.

9. A transistor device, comprising:
   a source region;
   a drain region;
   an InGaAs channel material disposed between the source and drain region;
   a ZnCdSe compound layer epitaxially grown on the InGaAs channel material, where the ZnCdSe compound layer composition is selected to set a bandgap and a lattice constant in relation to a bandgap and a lattice constant of the InGaAs channel material; and
   a gate conductor formed on the ZnCdSe compound layer.

10. The device as recited in claim 9, wherein the ZnCdSe compound layer composition is selected to be lattice matched to InGaAs.

11. The device as recited in claim 9, wherein the ZnCdSe compound layer includes $Zn_xCd_yMg_{1-x-y}Se$ where x and y include fractions to provide an operational bandgap while lattice matching to the InGaAs channel material.

12. The device as recited in claim 9, wherein the InGaAs channel material is strained, and the ZnCdSe compound layer composition is selected to have a lattice constant to counter strain in the InGaAs layer.

13. The device as recited in claim 9, further comprising a high-k dielectric layer formed on the ZnCdSe compound.

14. The device as recited in claim 9, wherein the InGaAs channel material is formed on a silicon based substrate.

15. The device as recited in claim 14, further comprising one or more lattice matching layers disposed between the InGaAs channel material and the silicon based substrate.

16. The device as recited in claim 9, wherein the InGaAs channel material is strained in accordance with atomic fraction of In in the InGaAs channel material.

17. A method for forming a transistor device, comprising:
providing a III-V channel material;
epitaxially growing a (X)Se compound on the III-V channel material, where X includes one or more of Zn, Cd and/or Mg, and where the (X)Se compound includes one of ZnCdSe or ZnCdMgSe;
depositing a gate conductor on the (X)Se compound to form a gate structure; and
forming a source region and drain region on opposite sides of the gate structure.

18. The method as recited in claim 17, wherein the III-V channel material includes InGaAs and further comprising:
adjusting an atomic weight in accordance with atomic fraction of In in the InGaAs channel material to provide strain in the InGaAs channel material.

19. The method as recited in claim 17, wherein the (X)Se compound includes $Zn_xCd_yMg_{1-x-y}Se$, and the method further comprises selecting x and y to set a bandgap and to lattice match to the III-V channel material.

* * * * *